United States Patent
Phillips

(10) Patent No.: US 6,770,902 B2
(45) Date of Patent: Aug. 3, 2004

(54) CHARGE CARRIER EXTRACTING TRANSISTOR

(75) Inventor: Timothy J Phillips, Malvern (GB)

(73) Assignee: QinetiQ Limited, Farnborough (GB)

( * ) Notice: Subject to any disclaimer, the term of this patent is extended or adjusted under 35 U.S.C. 154(b) by 0 days.

(21) Appl. No.: 10/258,853

(22) PCT Filed: Feb. 5, 2001

(86) PCT No.: PCT/GB01/01919

§ 371 (c)(1),
(2), (4) Date: Oct. 29, 2002

(87) PCT Pub. No.: WO01/88995

PCT Pub. Date: Nov. 22, 2001

(65) Prior Publication Data

US 2003/0080332 A1 May 1, 2003

(51) Int. Cl.[7] ...................... H01L 29/66; H01L 31/0328

(52) U.S. Cl. .......................... 257/20; 257/24; 257/192; 257/194; 257/195; 257/280; 257/281

(58) Field of Search ............................ 257/20, 24, 192, 257/194, 195, 280, 281, 283, 284, 155

(56) References Cited

U.S. PATENT DOCUMENTS 5,382,814 A    1/1995   Ashley et al.

FOREIGN PATENT DOCUMENTS

| EP | 0167305 A2 | 1/1986 |
| EP | 0460793 A1 | 12/1991 |
| GB | 2 266 183 A | 10/1993 |
| GB | 2331841 | * 2/1999 |
| GB | 2 331 841 A | 6/1999 |

OTHER PUBLICATIONS

Ching–Yuan Cheng et al; "The Study of Delta–Doping Concentration Effect On a Novel Quantum–Weel Hemt Structure"; ICSE '96., 1996 IEEE International Conference on Semiconductor Eletronics, Proceedings (CAT. NO. 96$^{TH}$8198), ICSE '96., 1996 IEEE International Conference on Semiconductor Electronics, Proceedings, Penang, Malaysia, Nov. 26–18, 1996, pp. 209–212, XP002171356, 1996, New York, NY, USA, IEEE, USA ISBN: 0–7803–3388–8, p. 210; figures 1,2.

Werking J D et al; "High–Transconductance InAs/AlSb Heterojunction Field–Effect Transistor with Delta–Doped AlSb Upper Barriers"; IEEE Electronic Device Letters, US, IEEE Inc., New York, vol. 13, No. 3, Mar. 1, 1992, pp. 164–166, XP000369996, ISSN: 0741–3106.

Applied Physis Letters, vol. 59, No. 14, Sep. 1991, T. Ashley et al; "Ambient Temperature Diodes and Field–Effect Transistors in InSb/In1–x AlxSb" See pp. 1761–1763.

* cited by examiner

Primary Examiner—Minhloan Tran
Assistant Examiner—Tan Tran
(74) Attorney, Agent, or Firm—Nixon & Vanderhye P.C.

(57) ABSTRACT

An extracting transistor (10)—an FET—includes a conducting channel extending via a p-type InSb quantum well (22) between p-type InAlSb layers (20, 24) of wider band-gap. One of the InAlSb layers (24) incorporates an ultra-thin n-type δ-doping layer (28) of Si, which provides a dominant source of charge carriers for the quantum well (22). It bears n$^+$ source and drain electrodes (30a, 30b) and an insulated gate (30c). The other InAlSb layer (20) adjoins a barrier layer (19) of still wider band-gap upon a substrate layer (14) and substrate (16) with electrode (18). Biasing one or both of the source and drain electrodes (30a, 30b) positive relative to the substrate electrode (18) produces minority carrier extraction in the quantum well (22) reducing its intrinsic contribution to conductivity, taking it into an extrinsic saturated regime and reducing leakage current.

24 Claims, 1 Drawing Sheet

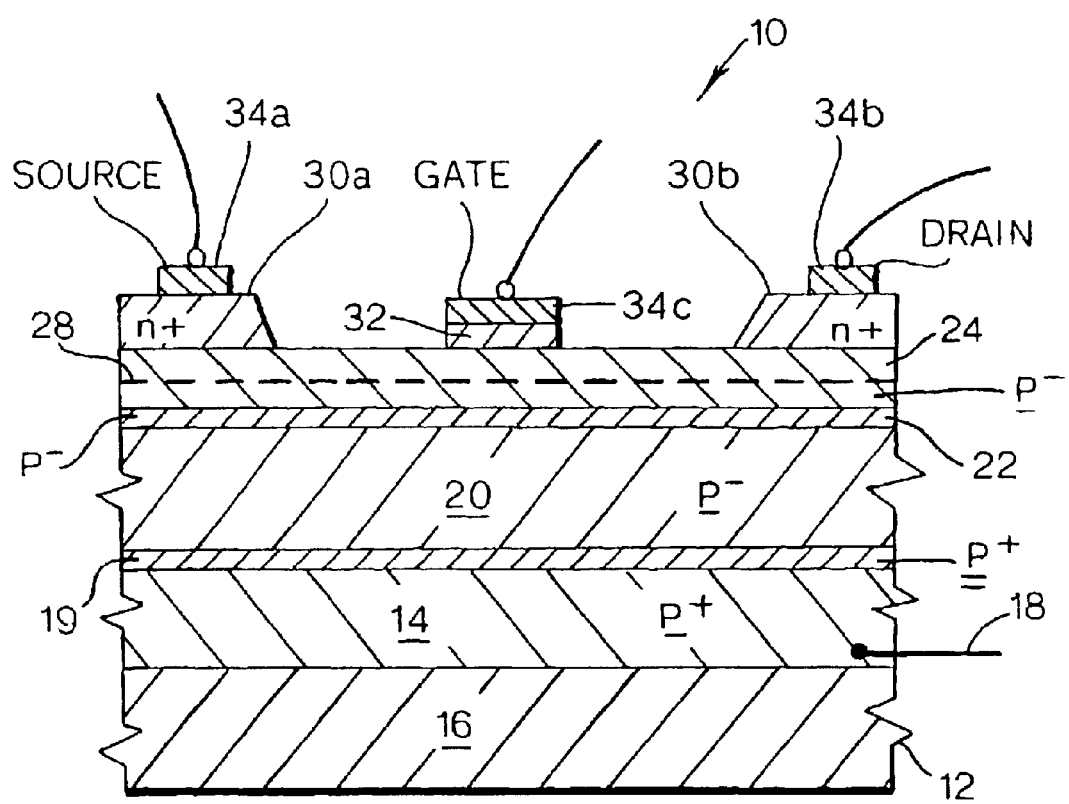

CHARGE CARRIER EXTRACTING TRANSISTOR

This application is the US national phase of international application PCT/GB01/01919 filed May 2, 2001, which designated the US.

BACKGROUND OF THE INVENTION

1. Field of the Invention

This invention relates to an extracting transistor, that is to say a transistor in which intrinsic conductivity is reduced by carrier extraction.

2. Discussion of Prior Art

Before considering the prior art, semiconductor nomenclature and properties will be discussed. Transistor operation relies on electrical transport effects in semiconductor material, and, broadly speaking, there are three important conduction regimes: unsaturated extrinsic, saturated extrinsic and intrinsic, and these occur at low, intermediate and high temperature respectively. In the unsaturated extrinsic regime, there is insufficient thermal energy to ionise all impurities and the carrier concentration is temperature dependent because more impurities are ionised as temperature increases. Carriers are thermally activated from dopant impurities of a single species, i.e. donors or acceptors. Conduction is due substantially to one kind of carrier in one band, i.e. electrons in the conduction band or holes in the valence band but not both. The saturated extrinsic regime is similar, but occurs at higher temperatures at which virtually all impurities have become ionised but insufficient thermal energy is available to ionise significant numbers of valence band states to create electron-hole pairs: here the carrier concentration is largely independent of temperature.

In the intrinsic regime, conduction has a substantial contribution from thermal ionisation of valence band states producing both types of carrier, i.e. electron-hole pairs, in addition to carriers of one type activated from impurities. Conduction is due to both kinds of carrier in both bands, i.e. electrons in the conduction band and holes in the valence band. Conductivity varies with temperature in this regime because the electron-hole pair concentration is temperature dependent. There is an intervening transition region between the extrinsic and intrinsic regimes where conduction is partially extrinsic and partially intrinsic giving rise to more of one type of charge carrier than the other, i.e. majority carriers and minority carriers: it is at or near ambient temperature in Ge depending on doping. The onset temperature of intrinsic conduction depends on band gap and dopant concentration; it can occur below ambient temperature, as low as 150K in narrow gap semiconductors with low doping.

Materials such as Si and GaAs with a saturated extrinsic regime at ambient temperature are preferred for transistor applications despite their inferior mobility properties: this is because of the need for very low intrinsic carrier concentrations in the active regions of devices. Highly pure Ge is intrinsic at ambient temperature, and by analogy with this weakly doped Si is sometimes referred to wrongly as intrinsic, such as in PIN diodes where the high resistivity I ("intrinsic") region is in fact extrinsic at ambient temperature. The purest Si currently available is more than an order of magnitude too impure to be intrinsic at ambient temperature.

Narrow band-gap semiconductors such as indium antimonide (InSb) have useful properties such as very low electron effective mass, very high electron mobility and high saturation velocity. These are potentially of great interest for ultra high speed transistor applications. InSb in particular is a promising material for fast, very low power dissipation transistors, because its electron mobility $\mu_e$ at low electric fields is nine times higher than that of GaAs and its saturation velocity $v_{sat}$ is more than five times higher, despite GaAs having better properties than Si in these respects. InSb is also predicted to have a large ballistic mean free path of over 0.5 $\mu$m. This suggests that InSb has potential for high speed operation at very low voltages with consequent low power consumption, which would make it ideal for portable and high-density applications. Some of the properties of Silicon, GaAs and InSb at 295K (ambient temperature) are compared in Table 1 below.

TABLE 1

Properties of InSb at 295 K

| Parameter | Silicon | GaAs | InSb | Units |
|---|---|---|---|---|
| $E_G$ Band-gap | 1.12 | 1.43 | 0.175 | eV |
| $m_e^*$ Electron Effective Mass | 0.19 | 0.072 | 0.013 | $m_0$ |
| $\mu_e$ Saturation Mobility | 1,500 | 8,500 | 78,000 | cm$^2$ V$^{-1}$ s$^{-1}$ |
| $v_{sat}$ Saturation Velocity | 1'10$^7$ | 1'10$^7$ | >5'10$^7$ | cm s$^{-1}$ |
| $l_e$ Electron Mean Free Path | 0.04 | 0.15 | 0.58 | $\mu$m |
| $n_i$ Intrinsic Carrier Concentration | 1.6'10$^{10}$ | 1.1'10$^7$ | 1.9'10$^{16}$ | cm$^{-3}$ |

Until recently, the potentially valuable properties of InSb have been inaccessible at ambient temperatures due to its low band-gap and consequently high intrinsic carrier concentration ($\sim 2 \times 10^{16}$ cm$^{-3}$), which is six and nine orders of magnitude above those of Si and GaAs respectively. This leads to InSb devices exhibiting high leakage currents at normal operating temperatures at or near ambient temperature of 295K, where the minority carrier concentration is much greater than the required value at normal doping levels. It was thought for many years that this was a fundamental problem which debarred InSb and other narrow band-gap materials from use in devices at ambient temperature and above.

The problem was however overcome to some extent in the invention the subject of U.S. Pat. No. 5,382,814: this patent discloses a non-equilibrium metal-insulator-semiconductor field effect transistor (MISFET) using the phenomena of carrier exclusion and extraction to reduce the intrinsic contribution to the carrier concentration below the equilibrium level. The MISFET is a reverse-biased p$^+$p$^+$p$^-$n$^+$ structure, where p denotes an InSb layer, p is a strained In$_{1-x}$Al$_x$Sb layer (underlined p indicates wider band-gap than p), p$^-$ indicates a weakly doped p-type region that is intrinsic at ambient operating temperature, and the + superscript indicates a high dopant concentration; these four layers define three junctions between adjacent layer pairs, i.e. p$^+$p$^+$, p$^+$p$^-$ and p$^-$n$^+$ junctions respectively. The active region of the device is the p$^-$ region, and minority carriers are removed from it at the p$^-$n$^+$ junction acting as an extracting contact. The p$^+$p$^-$ junction is an excluding contact which inhibits re-introduction of these carriers. In consequence, under applied bias the minority carrier concentration falls in the active region, and the majority carrier concentration falls with it to a like extent to preserve charge neutrality. This reduces electron and hole concentrations by like amounts, which corresponds to a reduction in the intrinsic contribution to conductivity (electron-hole pairs) and takes the active region into an extrinsic-like regime.

International Patent Application No. WO 99/28975 published under the Patent Cooperation Treaty relates to a similar transistor which has a straightened channel to improve frequency response. These prior art extracting devices however suffer from the problem that they exhibit relatively high leakage current which increases power requirements and operating temperature.

SUMMARY OF THE INVENTION

It is an object of the invention to provide an alternative form of extracting transistor capable of operation with lower leakage current than the prior art.

An extracting transistor characterised in that:
a) it is a field effect transistor incorporating a conducting region consisting at least partly of a quantum well;
b) the quantum well is in an at least partially intrinsic conduction regime when the transistor is unbiased and at a normal operating temperature; and
c) it includes at least one junction which is biasable to reduce intrinsic conduction in the quantum well and confine charge carriers predominantly to one type only corresponding to an extrinsic saturated regime.

The invention provides the advantage that with transistor design in accordance with ordinary skill in the art of semiconductor device fabrication it is capable of reducing leakage current considerably: examples of the invention have exhibited an order of magnitude reduction in leakage current.

The transistor of the invention may contain an excluding junction for inhibiting minority carrier supply to the quantum well; it may be arranged for carrier exclusion at least partly by incorporation of an excluding heterojunction between two semiconductor materials of differing band-gap both wider than that of the quantum well.

The biasable junction may be an extracting junction for removal of carriers from the quantum well. It may be a heterojunction between indium antimonide and a semiconductor material having a wider band gap than indium antimonide: e.g. indium aluminium antimonide with x is in the range 0.10 to 0.5, preferably 0.15 to 0.2 or substantially 0.15.

The excluding junction may be a heterojunction between indium antimonide and a semiconductor material having a wider band gap than indium antimonide.

The quantum well material may have a band gap less than 0.4 eV, and may be indium antimonide.

In a preferred embodiment, the transistor of the invention includes a δ-doping layer arranged to be a dominant source of charge carriers for the quantum well. It may have an $n^+$-$\underline{p}^-$-quantum well—$\underline{p}^-$-$p^+$-$\underline{p}^+$ diode structure or an $n^+$-$\underline{p}^-$-quantum well—$\underline{p}^-$-$\underline{\underline{p}}^+$ diode structure.

The transistor of the invention may include a first excluding junction for inhibiting minority carrier supply to the quantum well and wide band-gap barrier layer to enhance such inhibiting effect. It may include a gate contact insulated from the active region by insulating material such as silicon dioxide or wide band-gap semiconductor material.

The transistor may alternatively include a gate contact deposited directly upon a surface of the active region and forming a Schottky contact thereto.

In one embodiment, the transistor includes source, gate and drain electrodes and a substrate contact, the biasable junction is a pn junction reverse biasable via the substrate contact to produce minority carrier extraction from the quantum well, and the substrate contact is connected externally to the source electrode.

The transistor may be p-channel with a $p^+$-$\underline{n}^-$-quantum well—$\underline{n}^-$-$n^+$-$\underline{n}^+$ or a $p^+$-$\underline{p}^-$-quantum well—$\underline{p}^-$-$n^+$-$\underline{\underline{n}}^+$ structure, and include a δ-doping layer providing a predominant source of holes for the active region.

In another aspect, the invention provides a method of obtaining transistor operation characterised in that it includes the steps of:
a) providing an extracting field effect transistor incorporating:
   i) source, gate and drain electrodes and a substrate contact and between such electrodes and contact a pn junction biasable via the substrate contact for minority carrier extraction;
   ii) a conducting region consisting at least partly of a quantum well in an at least partially intrinsic conduction regime when the transistor is unbiased and at a normal operating temperature; and
   iii) at least one junction which is biasable to reduce intrinsic conduction in the quantum well and confine charge carriers predominantly to one type only corresponding to an extrinsic saturated regime;
b) biasing the substrate contact to reverse bias the pn junction and to arrange for the substrate contact either to be at the same potential as the source electrode, or to be negative or positive with respect to the source electrode according to whether such electrode is associated with a p-type or n-type component of the pn junction.

BRIEF DESCRIPTION OF THE DRAWINGS

In order that the invention might be more fully understood, an embodiment thereof will now be described, by way of example only, with reference to the accompanying single FIGURE drawing, which is a schematic vertical sectional view of an extracting transistor of the invention.

DETAILED DISCUSSION OF EMBODIMENTS

Referring to the drawing, an extracting, depletion mode, field effect transistor (FET) 10 is shown, but as indicated by zigzag lines such as 12 it is not drawn to scale. The FET 10 incorporates a 1 μm thick substrate layer 14 of $\underline{p}^+$-type $In_{0.85}Al_{0.15}Sb$ with a high dopant concentration of $2 \times 10^{18}$ $cm^{-3}$ upon an insulating substrate 16 of GaAs and having an electrical bias contact 18, which optionally may be relocated more remotely. The layer 14 bears an optional 20 nm thick barrier layer 19 of $p^+$-type $In_{0.7}Al_{0.3}Sb$ with a high dopant concentration $2 \times 10^{18}$ $cm^{-3}$: here double underlining of $\underline{\underline{p}}^+$ indicates wider band-gap than $\underline{p}^+$, which in turn (as has been said) indicates wider band-gap than p. The barrier layer 19 is surmounted by an 0.5 μm thick layer 20 of $\underline{p}^-$-type $In_{0.85}Al_{0.15}Sb$ which is doped at less than $3 \times 10^{16}$ $cm^{-3}$.

Upon the layer 20 there is a 15 nm thick quantum well 22 of $p^-$-type InSb with a dopant concentration of less than $3 \times 10^{16}$ $cm^{-3}$. The quantum well 22 is in turn surmounted by a 150 nm thick layer 24 (acceptable thickness range 100–200 nm): the latter consists largely of less than $3 \times 10^{16}$ $cm^{-3}$ $\underline{p}^-$-type $In_{0.85}Al_{0.15}Sb$; it incorporates an ultra-thin silicon n-type δ-doping layer 28. The δ-doping layer 28 is indicated by a chain line and is spaced apart from the quantum well 22 by a distance in the range 10–40 nm. It provides a two-dimensional electron gas with concentration per unit area in the range $6 \times 10^{11}$ $cm^{-2}$ to $2 \times 10^{12}$ $cm^{-2}$, e.g. $1 \times 10^{12}$ $cm^{-2}$: the gas forms in the quantum well 22 because it is energetically favourable—this is referred to as modulation doping, and the electron gas concentration remains substantially independent of temperature because it is a function of dopant concentration only.

The layer 24 has deposited upon it two outer n+ contact regions 30*a* and 30*b* of InSb 30 nm thick and a central insulator layer 32, and the latter 30a, 30b and 32 are in turn surmounted. by respective metal layers 34a, 34b and 34c (collectively 34). The insulator layer 32 may be silicon dioxide or a semiconductor material of wider band-gap than that of InSb. The metal layers 34 are electrical connections and act respectively as FET source and drain electrodes for the FET 10. The n+ contact regions 30a and 30b are separated by a distance in the range 0.5 to 2 μm, e.g. 1 μm.

The FET 10 is an $n^+$-$\underline{p}^-$-quantum well—$\underline{\underline{p}}^-$-$\underline{p}^-$-$\underline{p}^+$ diode structure in which the quantum well 22 undergoes carrier extraction when a reverse bias is applied, i.e. with one or both of the source and drain electrodes 34a and 34b biased positive with respect to the substrate layer contact 18. This is because the interfaces between layer 24 and each of layers 30a/30b is an $n^+\underline{p}^-$ junction which is an extracting contact when reverse biased. The carrier concentration in the quantum well 22 is reduced by bias to considerably below the intrinsic equivalent which prevails in the absence of bias, and here again it becomes largely independent of temperature simulating a saturated extrinsic regime: this provides a low leakage current between source 34a and drain 34b when negative bias is applied to the gate 34c to turn off the FET 10. Electrons from the δ-doping layer 28 are then the dominant source of charge carriers in the quantum well 22. The FET active region, i.e. the gate-controlled conducting channel between contact layers 30a and 30b is largely that in the quantum well 22. Layers 14, 19, 20 and 24 of the FET 10 have much wider band-gap than the quantum well 22 and the leakage current contributions from these regions can be ignored.

The principle of carrier extraction is known in the prior art and is described in for example European Patent No EP 0167305 and U.S. Pat. No. 5,016,073. It involves removing minority carriers from a semiconductor region at a greater rate than they are replaced; it occurs at a biased pn junction 24/30 to which minority carriers diffuse and over which they are swept by its potential drop—i.e. at which they are extracted and become lost to the region. These carriers (electrons in this case) cannot be replenished in the quantum well 22 because the only available source is the $\underline{p}^-$ layer 20 which has an inadequate (negligible) concentration of them: i.e. the $\underline{p}^-\underline{p}^-$ junction between layers 20 and 22 and the $\underline{\underline{p}}^+\underline{p}^-$ junction between layers 19 and 20 are what is referred to as excluding contacts which inhibit minority carriers reaching the quantum well 22.

In the FET 10 the carrier concentration in the quantum well (22) is kept low and temperature independent: this makes it more suitable than prior art devices for demanding applications. It performs well in this regard because the quantum well carrier concentration is very largely determined by modulation doping, which is a temperature-independent parameter unlike thermal activation of electron-hole pairs. The FET's off-state drain leakage current under bias (i.e. source-drain current with gate biased to cut-off) is at least an order of magnitude lower than comparable prior art devices.

By virtue of the gate insulation layer 32, the FET 10 is a metal-insulator-semiconductor device, i.e. a MISFET. It is possible to dispense with the insulation layer 32, which would make the gate electrode 34c a Schottky contact to the $\underline{p}^-$ layer 24. In this Schottky case the FET transconductance is about 3–4 times higher than that of a comparable prior art device with a typical gate oxide thickness of around 30–70 nm. Output conductance is typically half that of comparable prior art devices the subject of U.S. Pat. No. 5,382,814 and International Patent Application No. WO 99/28975 published under the Patent Cooperation Treaty. These properties are obtained largely as a result of the preponderance of wide band-gap semiconductor material in the FET 10: such material gives low leakage current and confinement of carriers in the quantum well 22 providing good transistor action i.e. high gain and low output conductance.

The barrier layer 19 is also optional because the FET 10 is viable without it: it is intended to provide lower off-state leakage current by providing more efficient carrier exclusion, but it is not known how significant this effect is. It provides an excluding junction between layers 19 and 20 additional to that between layers 20 and 22: this additional junction is a heterojunction between two semiconductor materials of like conductivity type (p-type) but differing band-gap both larger than that of indium antimonide.

The FET 10 may be operated with the substrate layer contact 18 reverse biased with respect to the source electrode 34a, or with the contact 18 and electrode 34a at the same potential, or with these shorted together. Since the FET 10 is largely p-type with n-type layers 30a and 30b, a reverse biased substrate layer contact 18 is negatively biased with respect to the source electrode 34a; for an equivalent FET of reversed layer conductivity type, i.e. p-type contact layers equivalent to layers 30a and 30b and other layers n-type, a reverse biased substrate layer contact 18 would be positively biased with respect to a source electrode; i.e. the substrate layer contact 18 is positive or negative with respect to the source electrode (34a) according to whether such electrode is associated with a n-type or p-type component (30a) of the extracting pn junction (24/30).

The FET 10 is an n-channel device because electrons provide conduction in the quantum well 22. A p-channel equivalent is formed by changing each layer 14/19/20/22/24/30 in the FET 10 to its respective opposite conductivity type: i.e. the $n^+$-$\underline{p}^-$-quantum well—$\underline{\underline{p}}^-$-$\underline{p}^-$-$\underline{p}^+$ structure becomes a $p^+$-$\underline{n}^-$-quantum well—$\underline{\underline{n}}^-$-$n^+$-$\underline{n}^+$ structure with a δ-doping layer of berylllium providing a predominant source of holes for the quantum well equivalent of layer 22. It is not in fact essential to change the conductivity types of the equivalents of the quantum well and its adjacent layers, i.e. layers 22, 20 and 24: these have low dopant concentrations and therefore do not greatly affect device operation; if they are not changed the resulting structure is $p^+$-$\underline{p}^-$-quantum well—$\underline{\underline{p}}^-$-$n^+$-$n^+$. Either of these p-channel devices may be advantageous because each contains a strained quantum well equivalent to layer 22, and such a well is believed to raise hole mobility due to more light hole transport.

What is claimed is:

1. An extracting transistor comprising:
   a field effect transistor incorporating a conducting region consisting at least partly of a quantum well;
   the quantum well is in an at least partially intrinsic conduction regime when the transistor is unbiased and at a normal operating temperature; and
   at least one junction which is biasable to reduce intrinsic conduction in the quantum well and confine charge carriers predominantly to one type only corresponding to an extrinsic saturated regime.

2. The transistor according to claim 1 including an excluding junction for inhibiting minority carrier supply to the quantum well.

3. The transistor according to claim 1 further including an excluding heterojunction between two semiconductor materials of differing band-gap both wider than that of the quantum well.

4. The transistor according to claim 1 wherein said biasable junction is an extracting junction for removal of carriers from the quantum well.

5. The transistor according to claim 4 wherein the extracting junction is a heterojunction between indium antimonide and a semiconductor material having a wider band gap than indium antimonide.

6. The transistor according to claim 5 wherein the wider band gap material is an indium aluminium antimonide material.

7. The transistor according to claim 6 wherein the indium aluminium antimonide material is $In_{1-x}Al_xSb$ where x is in the range 0.10 to 0.5.

8. The transistor according to claim 7 wherein x is in the range 0.15 to 0.2.

9. The transistor according to claim 8 wherein x is substantially 0.15.

10. The transistor according to claim 1 wherein the quantum well material has a band gap less than 0.4 eV.

11. The transistor according to claim 1 wherein the quantum well is of indium antimonide material.

12. The transistor according to claim 1 further including a δ-doping layer arranged to be a dominant source of charge carriers for the quantum well.

13. The transistor according to claim 1 including an $n^+$-$p^-$-quantum well- $p^-$-$p^+$-$p^+$diode structure.

14. The transistor according to claim 1 including an $n^+$-$p^-$-quantum well-$p^-$-$p^+$diode structure.

15. The transistor according to claim 1 including a first excluding junction for inhibiting minority carrier supply to the quantum well and a wide band-gap barrier layer to enhance such inhibiting effect.

16. The transistor according to claim 1 further including a gate contact insulated from the active region by insulating material.

17. The transistor according to claim 16 wherein the insulating material is silicon dioxide.

18. The transistor according to claim 1 further including a gate contact separated from the active region by semiconductor material of wider band-gap than that of region.

19. The transistor according to claim 1 further including a gate contact deposited directly upon a surface of the active region and forming a Schottky contact thereto.

20. The transistor according to claim 1 further including source, gate and drain electrodes and a substrate contact, the biasable junction is a pn junction reverse biasable via the substrate contact to produce minority carrier extraction from the quantum well, and the substrate contact is connected to the source electrode.

21. The transistor according to claim 1 wherein said transistor is a p-channel transistor.

22. The transistor according to claim 21 further comprising a $p^+$-$n^-$-quantum well- $n^-$-$n^+$-$n^+$structure with a δ-doping layer providing a predominant source of holes for the conducting region.

23. The transistor according to claim 21 further comprising a $p^+$-$p^-$-quantum well- $p^-$-$n^+$-$n^+$structure with a δ-doping layer providing a predominant source of holes for the conducting region.

24. A method of obtaining transistor operation comprising the steps of:

a) providing an extracting field effect transistor comprised of: source, gate and drain electrodes and a substrate contact and between such electrodes and contact a pn junction biasable via the substrate contact for minority carrier extraction;

a conducting region consisting at least partly of a quantum well in an at least partially intrinsic conduction regime when the transistor is unbiased and at a normal operating temperature; and at least one junction which is biasable to reduce intrinsic conduction in the quantum well and confine charge carriers predominantly to one type only corresponding to an extrinsic saturated regime;

b) biasing the substrate contact to reverse bias the pn junction and to arrange for the substrate contact either to be at the same potential as the source electrode, or to be positive or negative with respect to the source electrode according to whether such electrode is associated with a n-type or p-type component of the pn junction.

* * * * *